US012696418B2

(12) United States Patent
Carver et al.

(10) Patent No.: US 12,696,418 B2
(45) Date of Patent: Jul. 28, 2026

(54) INFORMATION HANDLING SYSTEM DEVICE BAY AND RETENTION SYSTEM

(71) Applicant: Dell Products L.P., Round Rock, TX (US)

(72) Inventors: Walter R. Carver, Round Rock, TX (US); Owen Kidd, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 193 days.

(21) Appl. No.: 18/137,451

(22) Filed: Apr. 21, 2023

(65) Prior Publication Data

US 2024/0357763 A1     Oct. 24, 2024

(51) Int. Cl.
*H05K 7/14*          (2006.01)

(52) U.S. Cl.
CPC .................................. *H05K 7/1489* (2013.01)

(58) Field of Classification Search
None
See application file for complete search history.

(56) References Cited

U.S. PATENT DOCUMENTS 6,313,997 B1 * 11/2001 Speraw ................ H05K 7/1424
                                                        361/740
6,317,329 B1 * 11/2001 Dowdy ................ H05K 7/1424
                                                        361/801

7,042,737 B1 * 5/2006 Woolsey .............. H05K 9/0062
                                                        361/753
10,212,842 B1 * 2/2019 Schulze ............... G11B 33/128
2002/0008964 A1 * 1/2002 Hutchison ........... H05K 7/1424
                                                        361/714
2004/0165360 A1 * 8/2004 Roesner ................. G06F 1/186
                                                        361/752
2006/0104038 A1 * 5/2006 Jones ................... H05K 7/1424
                                                        701/1
2013/0147327 A1 * 6/2013 Muhr ................... H05K 7/1424
                                                        228/141.1
2013/0170127 A1 * 7/2013 Ho ........................... G06F 1/185
                                                        361/679.31
2015/0062796 A1 * 3/2015 Yu ........................ H05K 5/0221
                                                        49/460
2022/0287194 A1 * 9/2022 Maguire .............. H05K 7/1494

FOREIGN PATENT DOCUMENTS

WO      WO-2019233896 A1 * 12/2019   .......... H01M 2/1077

* cited by examiner

*Primary Examiner* — Allen L Parker
*Assistant Examiner* — Christopher L Augustin
(74) *Attorney, Agent, or Firm* — Terrile, Cannatti & Chambers, LLP; Stephen A. Terrile

(57)          ABSTRACT

A device bay. The device bay includes a housing, the housing comprising a card connector positioned along a side wall of the housing and a hinged structural side wall, the hinged structural side wall being configured to pivot between an opened position and a closed position, the opened position allowing insertion and removal of a card into the device bay, the closed position retaining the card within the device bay.

16 Claims, 11 Drawing Sheets

INFORMATION HANDLING SYSTEM DEVICE BAY AND RETENTION SYSTEM

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for providing a removable I/O device bay. In certain embodiments, removable I/O device bay provides a device bay and retention system which can be removed from the front of the server thus allowing the I/O card devices to be serviced from outside the server.

In one embodiment, the invention relates to a device bay, comprising: a housing, the housing comprising a card connector positioned along a side wall of the housing; and, a hinged structural side wall, the hinged structural side wall being configured to pivot between an opened position and a closed position, the opened position allowing insertion and removal of a card into the device bay, the closed position retaining the card within the device bay.

In another embodiment, the invention relates to a system comprising: a processor; a data bus coupled to the processor; and a device bay, the device bay comprising a housing, the housing comprising a card connector positioned along a side wall of the housing; and, a hinged structural side wall, the hinged structural side wall being configured to pivot between an opened position and a closed position, the opened position allowing insertion and removal of a card into the device bay, the closed position retaining the card within the device bay.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
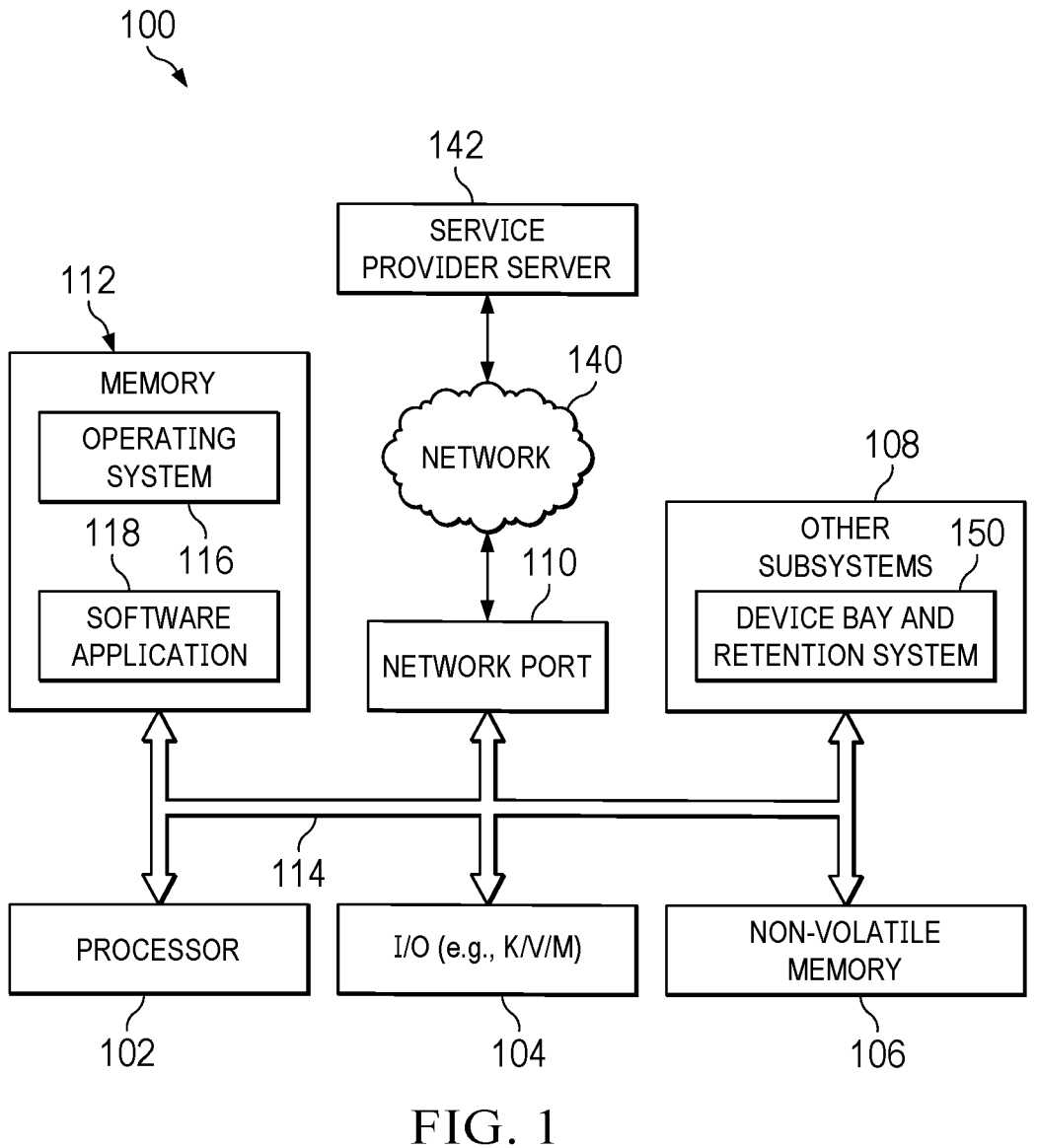
FIG. 1 shows a general illustration of components of an information handling system as implemented in the system and method of the present invention.

Various aspects of the disclosure include an appreciation that it is desirable to provide information handling systems which are included within are data centers with front service accessibility (also referred to as cold aisle accessibility). Various aspects of the disclosure include an appreciation that front service accessibility is especially desirable with large data centers such as those providing cloud functionality. Various aspects of the disclosure include an appreciation that moving servicing of I/O and storage devices to the "cold aisle," advantageously limits or eliminates access of service personal in the "hot aisle" of the data center.

Various aspects of the disclosure include an appreciation that configuring server type information handling systems with front side accessible I/O devices can present space and servicing challenges. Various aspects of the disclosure include an appreciation that these challenges can be especially pronounced with peripheral component interconnect express card electromechanical (PCIe CEM) form factor devices. Various aspects of the disclosure include an appreciation that PCIe CEM form factor devices often plug-in to system I/O slots from the side and not from the front. Various aspects of the disclosure include an appreciation that adding or removing a PCIe CEM form factor device can require additional space within the chassis for removal. Various aspects of the disclosure include an appreciation that adding this extra space for easy PCIe CEM form factor device removal would reduce the amount of storage and I/O devices that can fit in the front of the server type information handling system. Various aspects of the disclosure include an appreciation that adding access features for the PCIe CEM form factor devices within the server volume can necessitate adding removable panels to the sides of the server type information handling system which could compromise the structural integrity of the server type information handling system.

A system and method are disclosed for providing a removable I/O device bay. In certain embodiments, removable I/O device bay provides a device bay and retention system which can be removed from the front of the server thus allowing the I/O card devices to be serviced from outside the server. In certain embodiments, the device bay and retention system allows installation of a plurality of I/O cards. Such a device bay and retention system maximizes space and does not compromise the server structure with removal panels. In certain embodiments, the device bay and retention system includes a modular card housing, a hinged structural wall, a spring mechanism for card retention, and a thumbscrew for fastening the hinged structural wall to the modular card housing. In certain embodiments, the modular card housing is configured to receive PCIe CEM type cards. In certain embodiments, the modular card housing includes one or more card connectors. In certain embodiments, the one or more card connectors are configured to receive respective PCIe CEM type cards. In certain embodiments, the one or more card connectors In certain embodiments, the card housing is capable of translating laterally, as a unit, out of the front of the server. Once removed, the hinged structural wall attached to the side of the housing may be unfastened and swung aways from the housing up to substantially (i.e., +/−20%) 180 degrees on an integrated hinge. Rotating the hinged structural wall frees the cards and allows a user to perform service on the cards contained within the modular card housing. Once service of the cards is complete, the hinged structural wall is swung back into a seated position. When in the seated position, the hinged structural wall holds the cards in place. In certain embodiments, the integrated spring feature provides the force to hold the cards in place. When the cards are held in place, an edge of each card is coupled to a respective card connector contained within the modular card housing. In certain embodiments, a fastener such as a thumbscrew feature positioned at the end of the hinged structural wall fastens the hinged structural wall to the modular card housing.

Providing a hinged wall via which cards may be installed to and removed from the module card minimizes I/O device space. The hinged wall is configured to pivot about a hinge to swing out of the way, thus allowing for installation or removal of one or more cards such as one or more PCIe CEM card device. When this hinged wall is closed, an internal spring compresses on an I/O device bracket, holding it securely in place. This spring also serves as an electrical ground. When closed, the hinged wall is an integral part of the I/O device bay structure. The entire assembly serves to improve serviceability of cards such as PCI-e CEM cards in a rack server environment.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. In various embodiments, one or both the other subsystems 108 or the network port 110 include device bay and retention system 150. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more power supplies for supplying power to the other components of the information handling system 100.

In certain embodiments, the information handling system 100 comprises a server type information handling system. In certain embodiments, the server type information handling system comprises a rack server type information handling system. As used herein, a rack server type information handling system broadly refers to an information handling system which is physically configured to be mounted within a server rack.

In certain embodiments, the information handling system 100 includes a device bay and retention system 150 which provides a removable I/O device bay. In certain embodiments, removable I/O device bay provides a device bay and retention system 150 which can be removed from the front of the server thus allowing the I/O card devices to be serviced from outside the information handling system. In certain embodiments, the device bay and retention system 150 allows installation of a plurality of I/O cards. Such a device bay and retention system 150 maximizes space and does not compromise the server structure with removable panels. In certain embodiments, the device bay and retention system 150 includes a modular card housing, a hinged structural wall, a spring mechanism for card retention, and a thumbscrew for fastening the hinged structural wall to the modular card housing. In certain embodiments, the modular card housing is configured to receive PCIe CEM type cards. In certain embodiments, the modular card housing includes one or more card connectors. In certain embodiments, the one or more card connectors are configured to receive respective PCIe CEM type cards. In certain embodiments, the one or more card connectors In certain embodiments, the card housing is capable of translating laterally, as a unit, out of the front of the server. Once removed, the hinged structural wall attached to the side of the housing may be unfastened and swung aways from the housing up to substantially (i.e., +/−20%) 180 degrees on an integrated hinge. Rotating the hinged structural wall frees the cards and allows a user to perform service on the cards contained within the modular card housing. Once service of the cards is complete, the hinged structural wall is swung back into a seated position. When in the seated position, the hinged structural wall holds the cards in place. In certain embodiments, the integrated spring feature provides the force to hold the cards in place. When the cards are held in place, an edge of each card is coupled to a respective card connector contained within the modular card housing. In certain embodiments, a fastener such as a thumbscrew feature positioned at the end of the hinged structural wall fastens the hinged structural wall to the modular card housing.

Providing a hinged wall via which cards may be installed to and removed from the module card minimizes I/O device space for the information handling system. The hinged wall is configured to pivot about a hinge to swing out of the way, thus allowing for installation or removal of one or more cards such as one or more PCIe CEM card device. When this hinged wall is closed, an internal spring compresses on an I/O device bracket, holding it securely in place. This spring also serves as an electrical ground. When closed, the hinged wall is an integral part of the I/O device bay structure. The entire assembly serves to improve serviceability of cards such as PCI-e CEM cards in a rack server environment.

Figure 2:
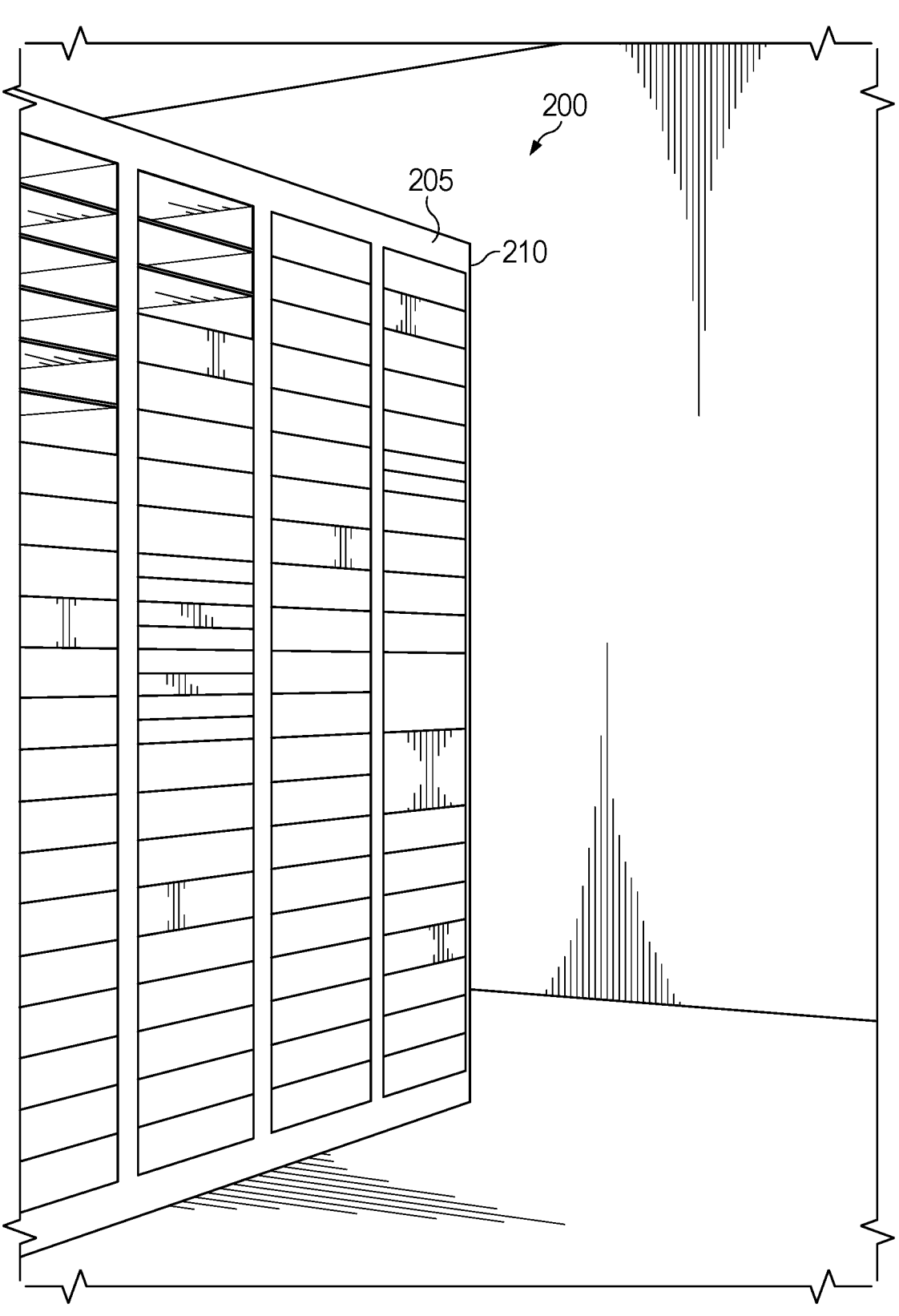
FIG. 2 shows a perspective view of a portion of a data center within an IT environment.

FIG. 2 shows a perspective view of a portion of an IT environment 200. The IT environment includes one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems and application delivery controller type information handling systems. In certain environments, the information handling systems 100 are mounted within respective racks. As used herein, a rack refers to a physical structure that is designed to house the information handling systems 100 as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

In certain embodiments, a plurality of racks is arranged continuous with each other to provide a rack system. An IT environment can include a plurality of rack systems arranged in rows with aisles via which IT service personnel can access information handling systems mounted in the racks. In certain embodiments, the aisles can include front aisles (also referred to as cold aisle) via which the front of the information handling systems may be accessed and hot aisles via which the rear of the information handing system and rack infrastructure (e.g., data and power cabling) of the IT environment can be accessed.

Each respective rack includes a plurality of vertically arranged information handling systems 210. In certain embodiments, the information handling systems may conform to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1 U rack unit, a 2 U rack unit and a 4 U rack unit. In general, a 1 U rack unit is substantially (i.e., +/−20%) 1.75" high, a 2 U rack unit is substantially (i.e., +/−20%) 3.5" high and a 4 U rack height is substantially (i.e., +/−20%) 7.0" high.

Figure 3:
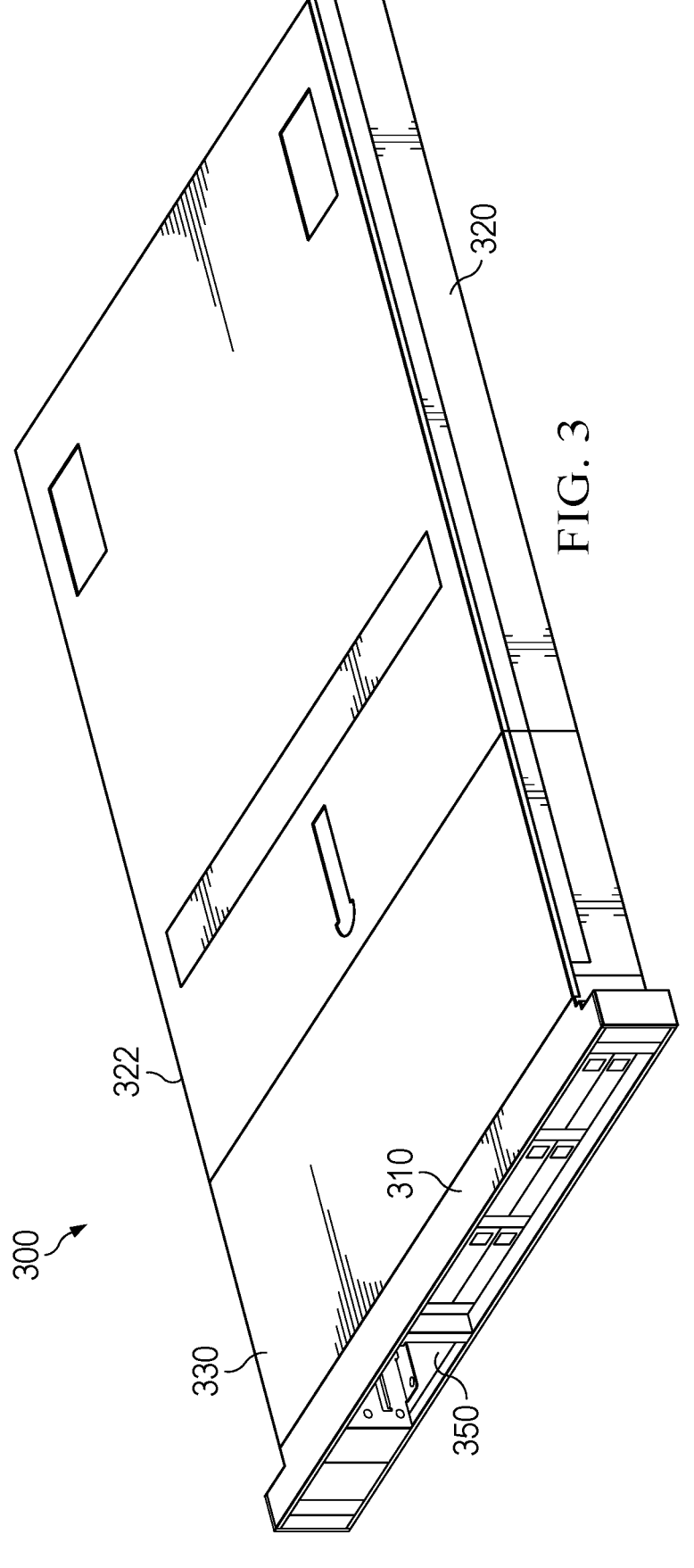
FIG. 3 shows a generalized perspective view of an example server type information handling system.

FIG. 3 shows a generalized perspective view of an example server type information handling system 300. In certain embodiments, the server type information handling system includes a front portion 310, which is accessible when the server type information handing system 300 is mounted on a server rack. In certain embodiments, the side portions 320, 322 mount to the rack via respective server mounting components. In certain embodiments, the side portions mount to the rack via respective mechanical guiding features which are mechanically coupled to respective server mounting components. In certain embodiments, the server type information handling system can slide out from the rack via the respective mechanical guiding features. In certain embodiments, internal components of the server type information handling system 300 may be accessed by removing a top panel 330 of the server type information handing system 300. In certain embodiments, the server type information handing system 300 includes a bay 350 via which components may be mounted to the server type information handling system.

Figure 4A:
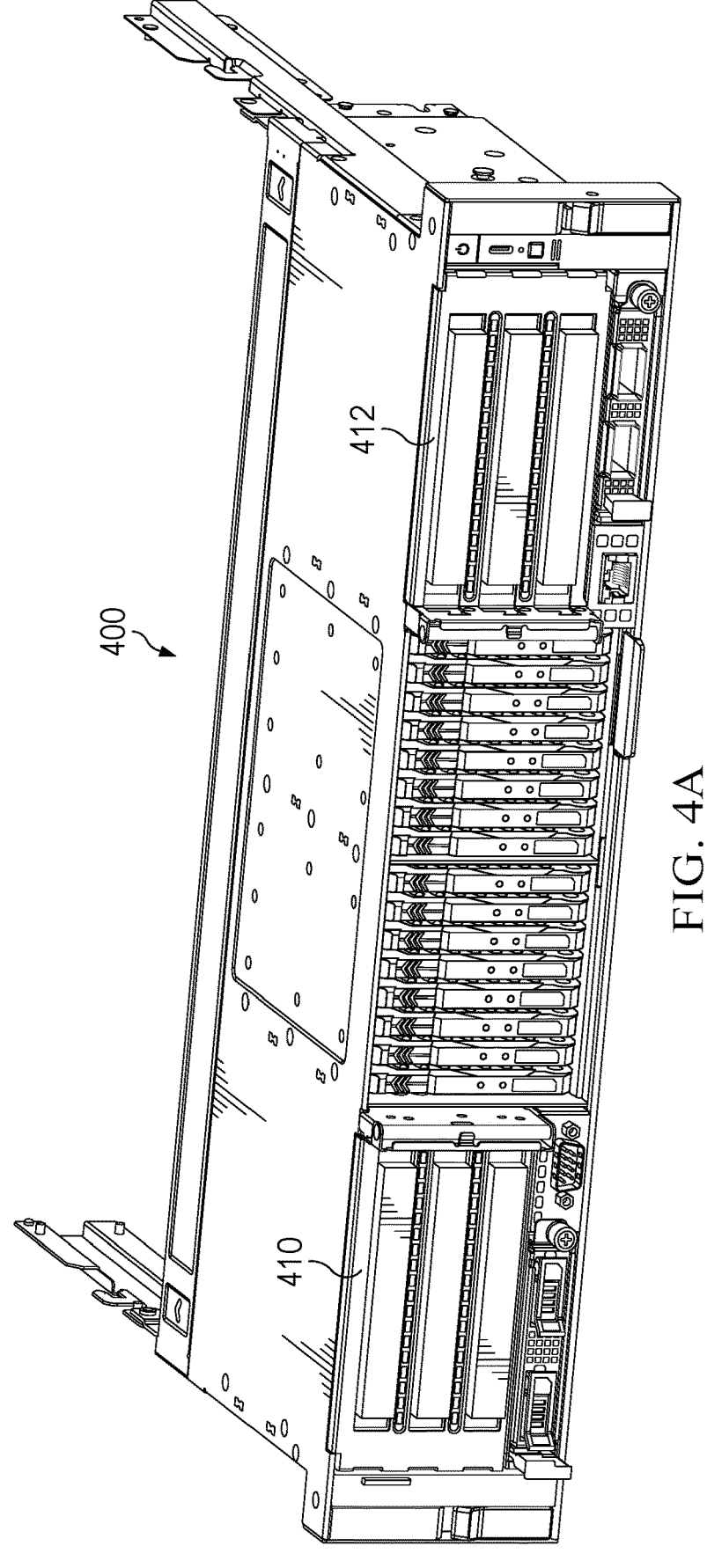
FIG. 4A, generally referred to as FIG. 4, shows a perspective front view of a server type information handling system with a plurality of device bay and retention components.
Figure 4B:
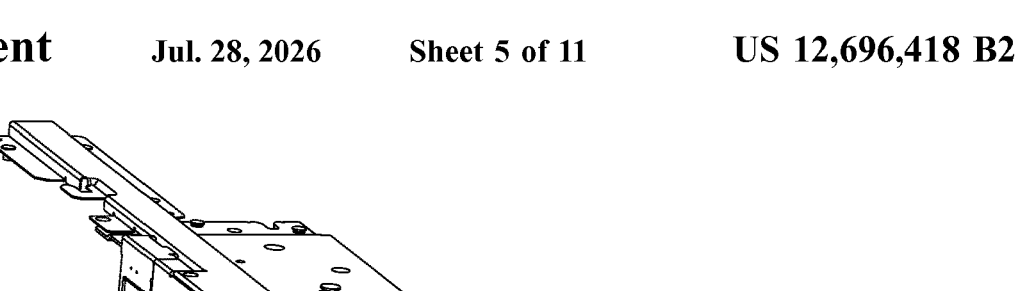
FIG. 4B, generally referred to as FIG. 4, shows a perspective front view of a server type information handling system with a plurality of uninstalled device bay and retention components.

FIG. 4 shows a perspective front view of a server type information handling system with a plurality of device bay and retention components. FIG. 4B shows a perspective front view of a server type information handling system with a plurality of uninstalled device bay and retention components.

In certain embodiments, the information handling system 400 includes a plurality of device bay and retention systems 410, 412 which provides a removable I/O device bay. In certain embodiments, the device bay and retention system may be in an upright orientation (see e.g., 410) or in an inverted orientation (see e.g., 412). In certain embodiments, the upright orientation is positioned along a left side of the information handling system and the inverted orientation is positioned along a right side of the information handling system 400. In certain embodiments, each device bay and retention system 410, 412 can be installed and removed from respective voids 420, 422 located at the front of the information handling system 400 thus allowing the I/O card devices to be serviced from outside the information handling system 400. In certain embodiments, the device bay and retention system 410, 412 allows installation of a plurality of I/O cards. Such a device bay and retention system 410, 412 maximizes space and does not compromise the server structure with removable panels. In certain embodiments, the card housing is capable of translating laterally, as a unit, out of the front of the server.

In certain embodiments, one wall of the device bay and retention system includes one or more receiver components 440. In certain embodiments, each receiver component mates with a corresponding projection 442 extending from an inside wall of the information handling system 400. By providing such a mating structure, each device bay and retention system is held in place when installed within the void of the information handling system 400.

In certain embodiments, the device bay and retention system 410, 412 translates laterally, as a unit, out of the front of the server. Once removed, the hinged structural wall attached to the side of the housing may be unfastened and swung away from the housing up to substantially (i.e., +/−20%) 180 degrees on an integrated hinge. Rotating the hinged structural wall frees the cards and allows a user to perform service on the cards contained within the modular card housing. Once service of the cards is complete, the hinged structural wall is swung back into a seated position. When in the seated position, the hinged structural wall holds the cards in place.

Figure 5A:
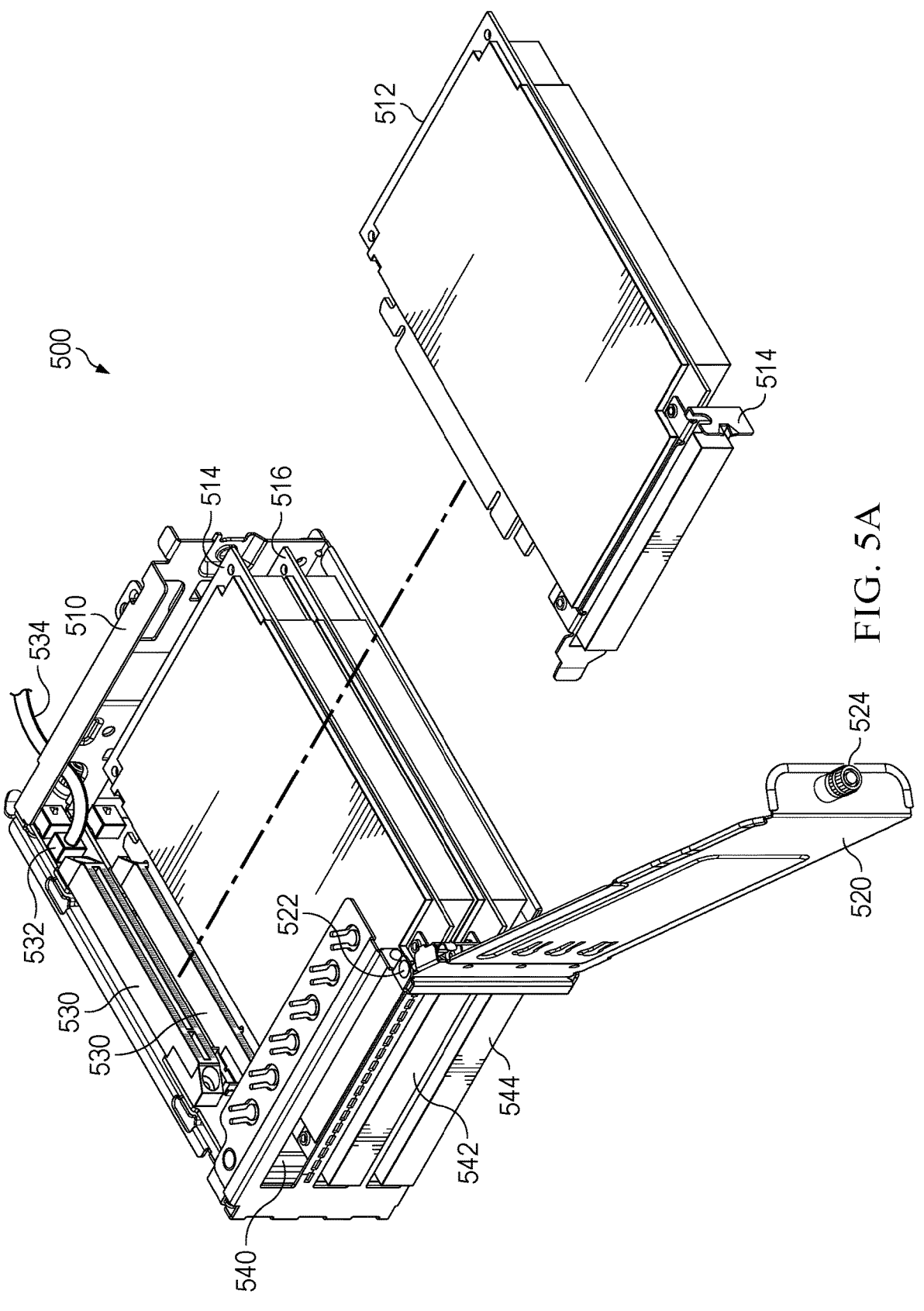
FIGS. 5A, 5B and 5C, generally referred to as FIG. 5, show perspective views of a device bay and retention system 500 as well as a plurality of devices in various states of install.
Figure 5B:
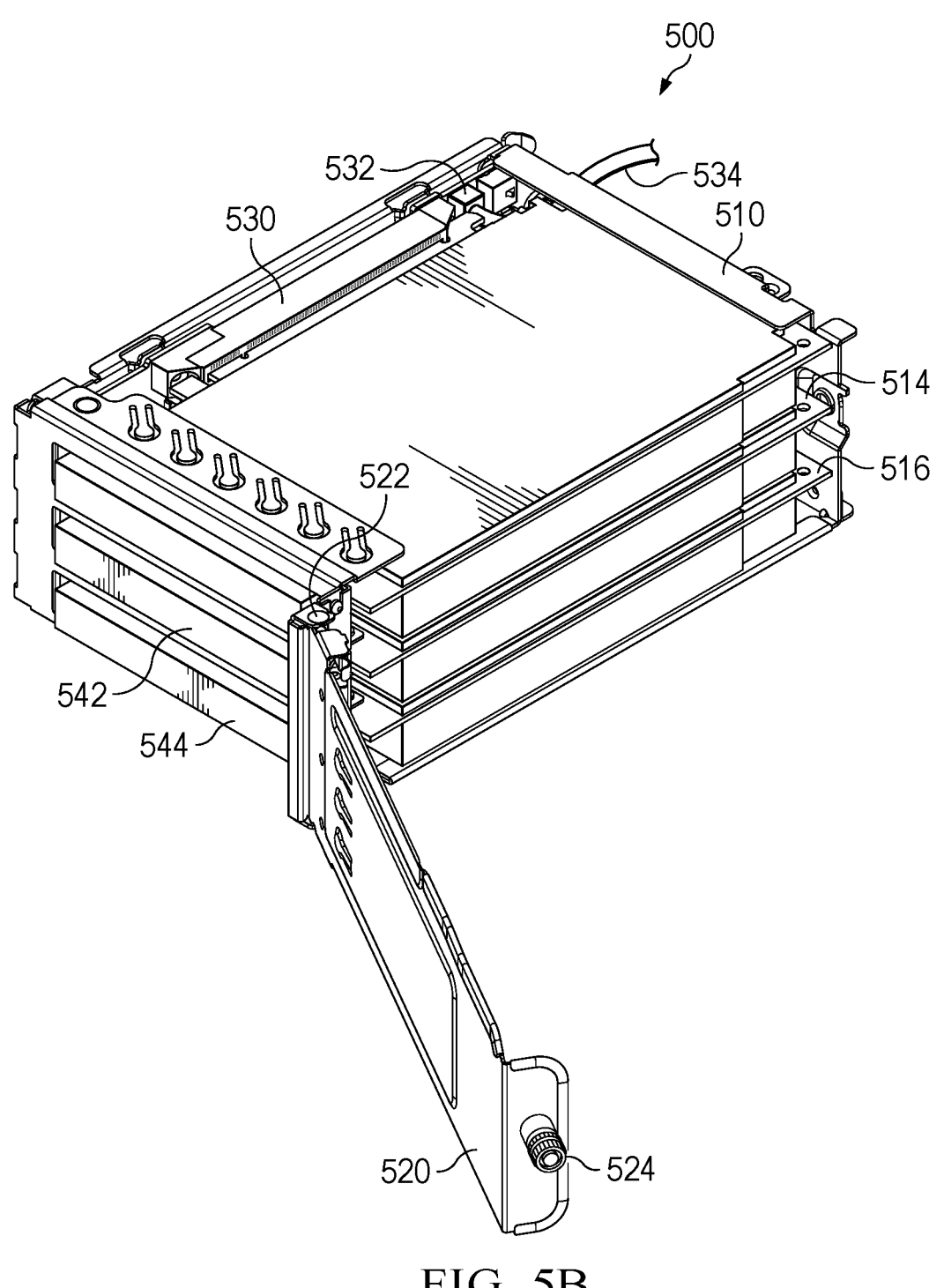
Figure 5C:
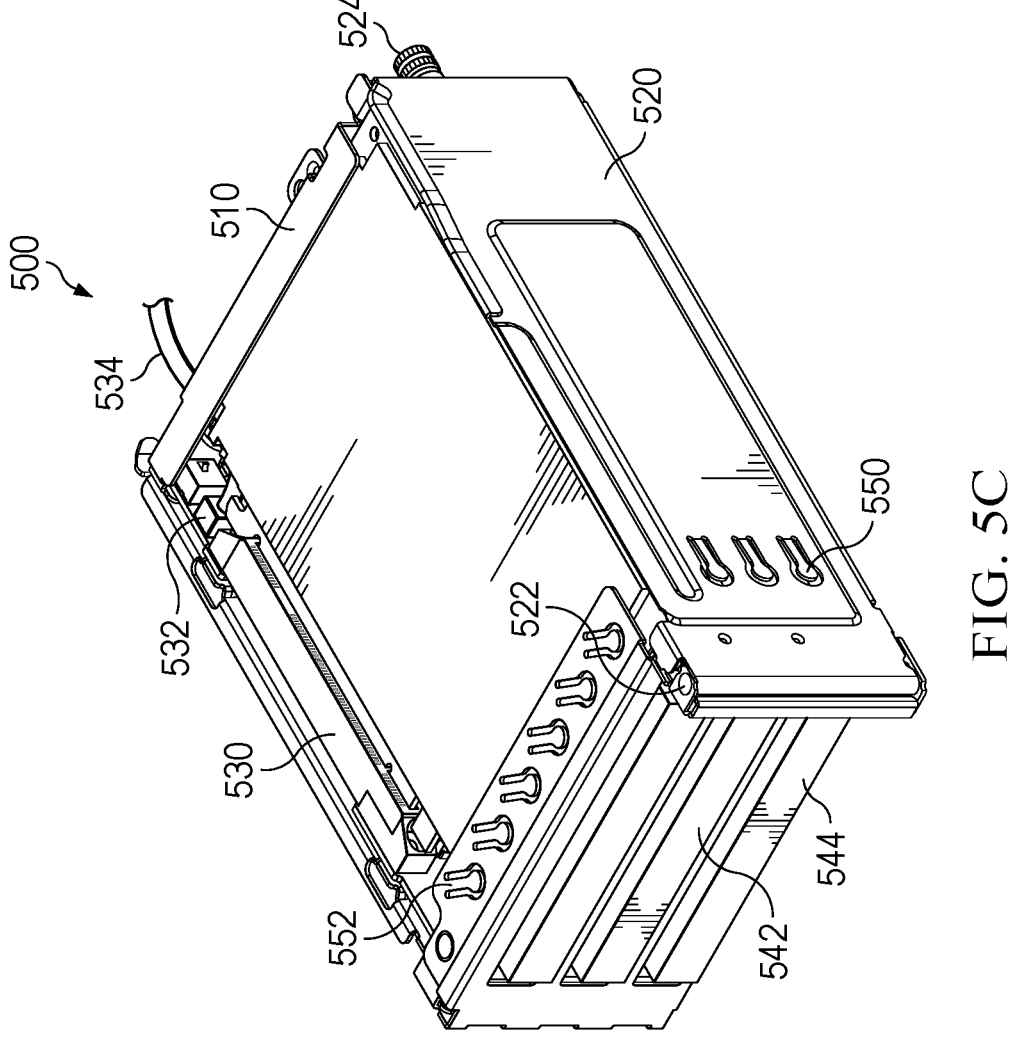
Figure 5D:
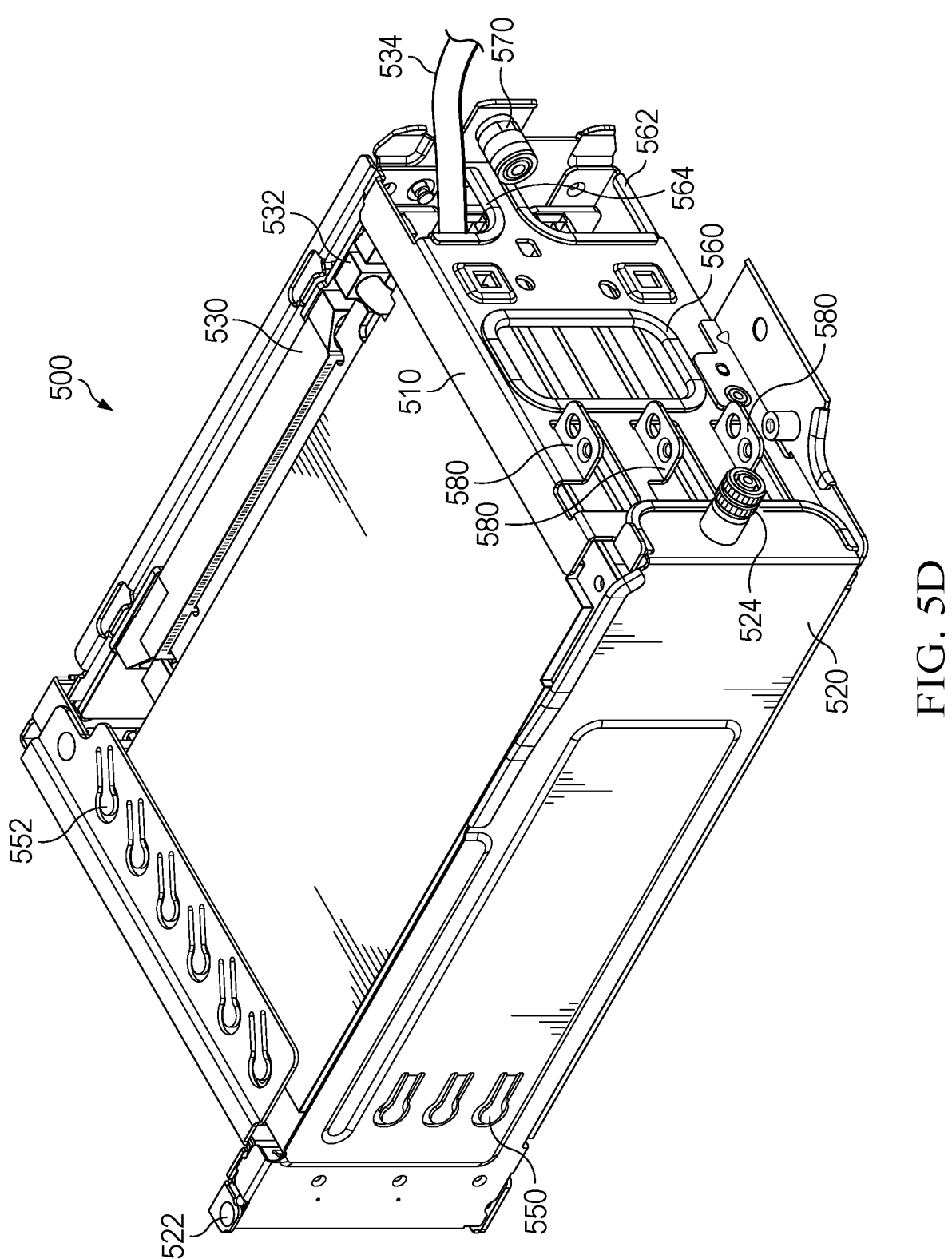
FIG. 5D, generally referred to as FIG. 5, shows a rear perspective view of a device bay and retention system.

FIGS. 5A, 5B and 5C, generally referred to as FIG. 5, show perspective views of a device bay and retention system 500 as well as a plurality of devices in various states of install. FIG. 5D, generally referred to as FIG. 5, shows a rear perspective view of a device bay and retention system.

In certain embodiments, the device bay and retention system 500 includes a modular card housing 510, a hinged structural side wall 520, a hinge 522 and a fastener 524 (e.g., a thumbscrew) for fastening the hinged structural side wall 520 to the modular card housing 510 when the hinged structural side wall 520 is in a closed position. In certain embodiments, the modular card housing is configured to receive I/O cards 512. In certain embodiments, the I/O cards 512 plug in to I/O slots from the side of the I/O card. In certain embodiments, the I/O cards 512 are PCIe CEM type cards. In certain embodiments, the I/O cards 512 include respective brackets 514 to provide a ground path from the I/O cards 512 to the device bay and retention system 500. In certain embodiments, the modular card housing includes one or more card connectors 530. In certain embodiments, the one or more card connectors 530 are configured to receive respective PCIe CEM type cards. In certain embodiments, the one or more card connectors 530 are mounted to the inside of a side wall of the modular card housing 510. In certain embodiments, each card connector 530 is mounted horizontally to the inside of the side wall of the modular card housing 510. In certain embodiments, a plurality of card connectors 530 are dispersed vertically across the inside of the side wall of the module card housing 510 to allow a plurality of cards to be mounted within the device bay and retention system 500.

In certain embodiments, pins of a card connector 530 are coupled to a respective printed circuit board 532 which is in turn coupled to a cable bundle 534 to provide a signal path from the card connector 530 to the server. In certain embodiments, the wall to which the connectors are mounted is position opposite to the hinged structural wall 520. In certain embodiments, a front wall of the modular card housing 510 define one or more apertures 540 via which a front edge of respective cards 512 may be accessed when the cards are installed within the device bay and retention system 500.

In certain embodiments, the device bay and retention system 500 translates laterally, as a unit, out of the front of the server. Once removed, the hinged structural wall 520 attached to the side of the housing 510 may be unfastened and swung aways from the housing up to substantially (i.e., +/−20%) 180 degrees on the integrated hinge 522. Rotating the hinged structural wall 520 frees the cards 512 and allows a user to perform service on the cards 512 contained within the modular card housing 510. Because the hinge 522 is located on a portion of the housing which extends from an edge of the main body of the housing 510, the hinged wall 522 allows full access to the housing when a card is installed or removed from the housing. Once service of the cards is complete, the hinged structural wall 520 is swung back into a seated position (see e.g., FIG. 5C). When in the seated position, the hinged structural wall 520 holds the cards 512 in place. When the cards are held in place, an edge of each card is coupled to a respective card connector 530 contained within the modular card housing. In certain embodiments, a fastener 524 such as a thumbscrew feature positioned at the end of the hinged structural wall 520 fastens the hinged structural wall to the modular card housing.

Providing a hinged wall 520 via which cards 512 may be installed to and removed from the device bay and retention system 500 minimizes I/O device space for the information handling system. The hinged wall 520 is configured to pivot about the hinge 522 to swing out of the way, thus allowing for installation or removal of one or more cards 512 such as one or more PCIe CEM card device. When this hinged wall is closed, an internal spring compresses on an I/O device bracket, holding it securely in place. This spring also serves as an electrical ground. When closed, the hinged wall is an integral part of the I/O device bay structure. The entire assembly serves to improve serviceability of cards such as PCI-e CEM cards in a rack server environment.

In certain embodiments, the hinged wall 520 includes spring components 550 which project slightly from the wall to ground the wall to an inside wall of an information handling system. In certain embodiments, the housing 510 includes spring components 552 which project slightly from the housing to ground the housing to an inside wall of an information handling system.

In certain embodiments, a rear wall of the housing 510 defines a plurality of apertures 560, 562, 564. In certain embodiments, the plurality of apertures 560, 562, 564 promote air flow across the I/O cards installed within the device bay and retention component 500. In certain embodiments, one or more cable bundles are passed through one or both of apertures 562, 564. By providing these apertures 562, 564 close to an outside wall of the housing 510, the cable bundles have a relatively straight path to connection with the information handling system, whether the housing 510 is in the upright orientation and positioned along a left side of the information handling system or in an inverted orientation positioned along a right side of the information handling system.

In certain embodiments, the rear portion of the housing 510 includes a latch 570 which secures the device bay and retention component 500 within the void defined by the server. In certain embodiments, the latch is a spring-loaded latch. In certain embodiments, the spring-loaded latch interacts with an aperture defined on an inside side wall of the server to secure the device bay and retention component to the server. In certain embodiments, the latch is accessed by removing a top panel of the server. In certain embodiments, the rear wall of the housing 510 includes a plurality of flanges 580. In certain embodiments, each flange 580 may have an attached support component (not shown) which extend into the housing 510 to provide physical support for a rear edge of a corresponding I/O card 512.

Figure 6A:
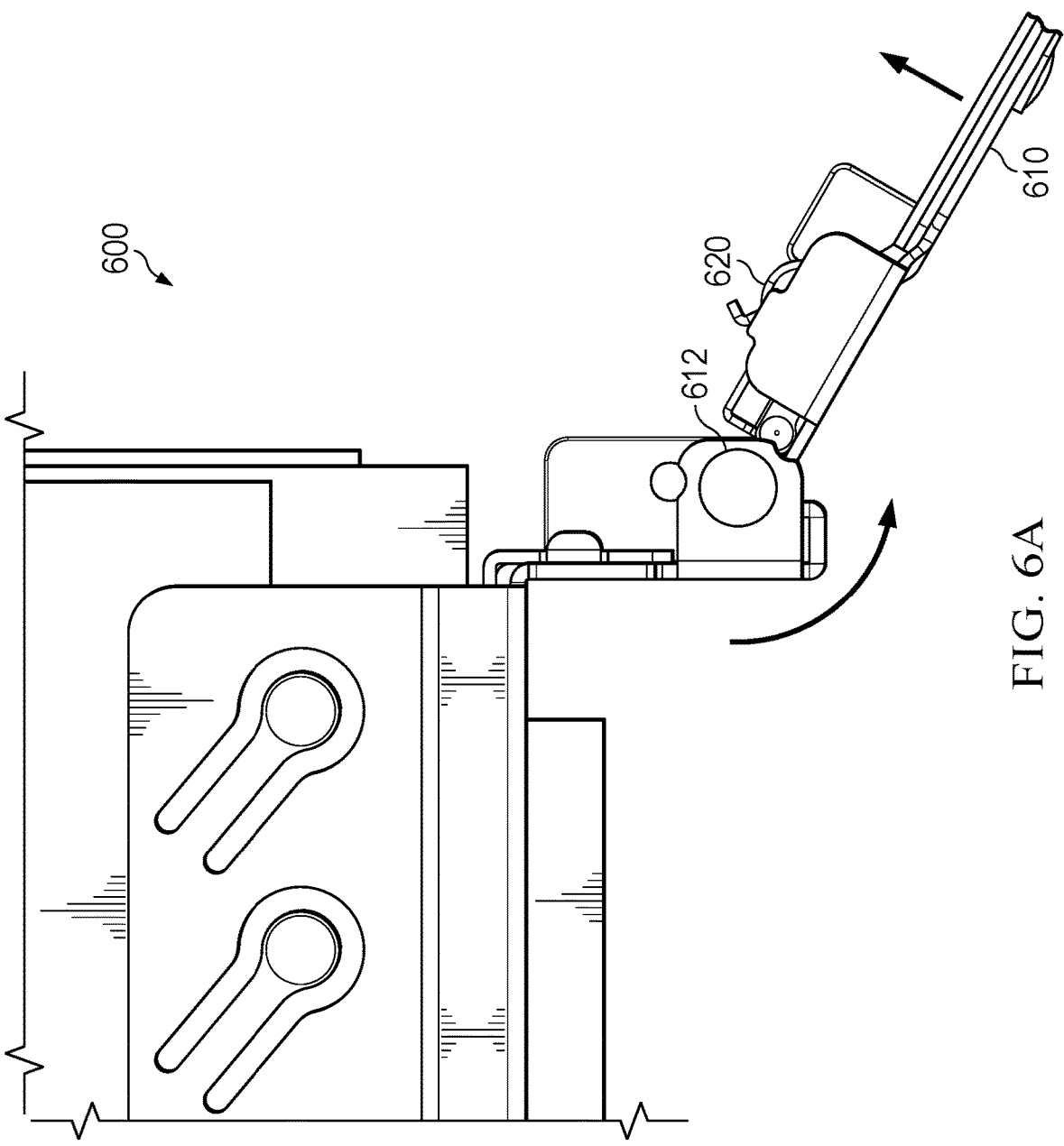
FIGS. 6A and 6B, generally referred to as FIG. 6, show top views of a portion of a device bay and retention component.
Figure 6B:
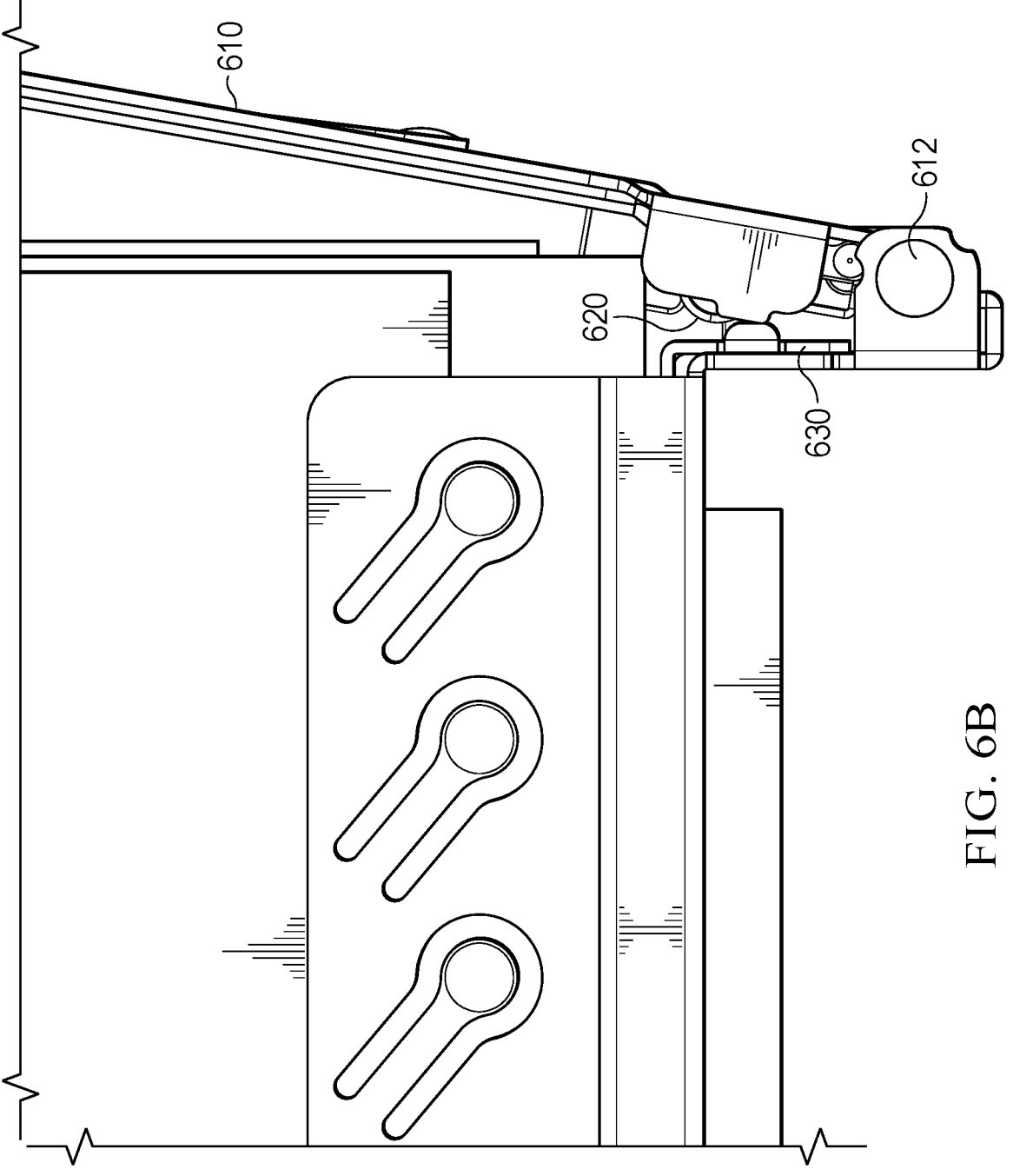

FIGS. 6A and 6B, generally referred to as FIG. 6, show top views of a portion of a device bay and retention component 600. The hinged wall 610 is configured to pivot about a hinge 612 to swing out of the way, thus allowing for installation or removal of one or more cards. Because the hinge 612 is located on a portion of the housing which extends from the main body of the housing, the hinged wall 610 allows full access to the housing when a card is installed or removed from the housing. In certain embodiments, the hinged wall of the device bay and retention component 600 includes an integrated spring feature 620. The integrated spring feature 620 provides the force to hold the cards in place when the hinged wall is closed. More specifically, when the hinged wall is closed, the internal spring 620 compresses on an I/O device bracket 630, holding the card securely in place (i.e., retaining the card). This spring feature 620 also serves as an electrical ground for the I/O devices. More specially, when closed, the spring feature 620 is electrically coupled with the device bracket 630 to provide a ground path from the I/O device to the device bay and retention component 600. When closed, the hinged wall 610 is an integral part of the I/O device bay structure.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A device bay, comprising:

a housing, the housing comprising a card connector positioned along a side wall of the housing and a corresponding slot, the card connector being mounted horizontally to an inside of the side wall of the housing, the card connector and the corresponding slot of the housing being configured to receive a card from a side of the housing opposite the side wall of the housing, the side wall of the housing including a receiver component positioned along an outside of the side wall of the housing, the receiver component being configured to mate with a projection extending from an inside wall of a void of an information handling system to hold the device bay in place when the device bay is installed within the void; and, a hinged structural side wall, the hinged structural side wall being configured to pivot between an opened position and a closed position, the opened position allowing insertion and removal of the card into the device bay, the closed position retaining the card within the device bay; and wherein the device bay is configured to be installed and removed from the void;

the void is located at a front of the information handling system to allow the card to be serviced from outside of the information handling system; and, the side wall of the housing is positioned along an inside wall of an outermost side wall of the void when the device bay is installed in the void and the hinged structural wall is positioned along an inner side wall of the void when the device bay is installed in the void.

2. The device bay of claim 1, wherein:

the side wall of the housing having the card connector is positioned opposite to the hinged structural side wall.

3. The device bay of claim 1, wherein:

the hinged structural side wall comprises a fastener, the fastener fastening the hinged structural side wall to the housing.

4. The device bay of claim 1, wherein:

the housing includes an extended portion, the extended portion vertically extending from a front edge of a main body of the housing opposite the side wall of the housing such that the extended portion extends vertically from a top of the void to a bottom of the void and is contiguous with the inner side wall of the void when the device bay is installed in the void; and, the hinged structural side wall is coupled to the extended portion via a hinge, the extended portion allowing full access to the housing when the card is installed and removed from the housing.

5. The device bay of claim 1, wherein:

at least one of the housing and the hinged structural wall include a spring component, the spring component projecting from the at least one of the housing and the hinged structural wall to ground the device bay to an information handling system when the device bay is mounted within the information handling system.

6. The device bay of claim 1, wherein:

the hinged structural side wall includes a spring feature, the spring feature compressing against the card when the hinged structural wall is in the closed position to hold the card in place.

7. The device bay of claim 1, wherein:

the card is configured to plug in to the card connector from a side of the device bay when the device bay is outside of the information handling system.

8. The device bay of claim 1, wherein:

the card comprises a peripheral component interconnect express PCIe type card.

9. A system comprising:

a processor;

a data bus coupled to the processor;

a device bay mounted within the system, the device bay being capable of translating laterally out of a front portion of the system, the device bay comprising:

a housing, the housing comprising a card connector positioned along a side wall of the housing and a corresponding slot, the card connector being mounted horizontally to an inside of the side wall of the housing, the card connector and the corresponding slot of the housing being configured to receive a card from a side of the housing opposite the side wall of the housing, the side wall of the housing including a receiver component positioned along an outside of the side wall of the housing, the receiver component being configured to mate with a projection extending from an inside wall of a void of an information handling system to hold the device bay in place when the device bay is installed within the void; and, a hinged structural side wall, the hinged structural side wall being configured to pivot between an opened position and a closed position, the opened position allowing insertion and removal of the card into the device bay, the closed position retaining the card within the device bay; and wherein the device bay is configured to be installed and removed from a void;

the void is located at a front of the system to allow the card to be serviced from outside of the system; and the side wall of the housing is positioned along an inside wall of an outermost side wall of the void when the device bay is installed in the void and the hinged structural wall is positioned along an inner side wall of the void when the device bay is installed in the void.

10. The system of claim 9, wherein:

the side wall of the housing having the card connector is positioned opposite to the hinged structural side wall.

11. The system of claim 9, wherein:

the hinged structural side wall comprises a fastener, the fastener fastening the hinged structural side wall to the housing.

12. The system of claim 9, wherein:

the housing includes an extended portion, the extended portion vertically extending from a front edge of a main body of the housing opposite the side wall of the housing such that the extended portion extends vertically from a top of the void to a bottom of the void and is contiguous with the inner side wall of the void when the device bay is installed in the void; and, the hinged structural side wall is coupled to the extended portion via a hinge, the extended portion allowing full access to the housing when the card is installed and removed from the housing.

13. The system of claim 9, wherein:

at least one of the housing and the hinged structural wall include a spring component, the spring component projecting from the at least one of the housing and the hinged structural wall to ground the device bay to an information handling system when the device bay is mounted within the system.

14. The system of claim 9, wherein:

the hinged structural side wall includes a spring feature, the spring feature compressing against the card when the hinged structural wall is in the closed position to hold the card in place.

15. The system of claim 9, wherein:

the card is configured to plug in to the card connector from a side of the device bay when the device bay is outside of the system.

16. The system of claim 9, wherein:

the card comprises a peripheral component interconnect express PCIe type card.

\*  \*  \*  \*  \*